United States Patent
Van Veldhoven

(10) Patent No.: US 7,042,378 B2
(45) Date of Patent: May 9, 2006

(54) CIRCUIT WITH A DIGITAL TO ANALOG CONVERTER

(75) Inventor: Robert Henrikus Margaretha Van Veldhoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/503,048

(22) PCT Filed: Jan. 23, 2002

(86) PCT No.: PCT/IB02/05721

§ 371 (c)(1), (2), (4) Date: Jul. 29, 2004

(87) PCT Pub. No.: WO03/065587

PCT Pub. Date: Aug. 7, 2003

(65) Prior Publication Data

US 2005/0140533 A1    Jun. 30, 2005

(30) Foreign Application Priority Data

Jan. 30, 2002   (EP)   .................. 02075648

(51) Int. Cl.
*H03M 1/66* (2006.01)
(52) U.S. Cl. ...................... 341/144; 341/145
(58) Field of Classification Search ................ 341/144, 341/155, 145, 156, 118, 126
See application file for complete search history.

(56) References Cited

U.S. PATENT DOCUMENTS

| | | | |
|---|---|---|---|
| 5,134,402 A | 7/1992 | Miyoshi | |
| 5,274,375 A | 12/1993 | Thompson | |
| 5,689,258 A * | 11/1997 | Nakamura et al. | 341/136 |
| 6,008,747 A | 12/1999 | Iida | |
| 6,329,941 B1 * | 12/2001 | Farooqi | 341/145 |
| 6,392,573 B1 * | 5/2002 | Volk | 341/118 |
| 6,489,905 B1 * | 12/2002 | Lee et al. | 341/120 |

FOREIGN PATENT DOCUMENTS

WO     WO 01 31793     5/2001

* cited by examiner

*Primary Examiner*—John B Nguyen
(74) *Attorney, Agent, or Firm*—Michael J. Ure

(57) ABSTRACT

A first and second signal source are coupled to an analog output in a digital input signal dependent configuration. The signal sources so that a contribution of their source signals adds up in a first or a second direction when the digital input assumes a first or a second value respectively. The source signals counteract each other when the digital input signal assumes a third value. The signs with which the source signals contribute to the analog signal level for the third value are alternated, so that both signs occur substantially equally frequently for each of the signal sources. The spectral density of a deviation signal due to said alternating is concentrated at high frequencies. In an embodiment the spectral density is moved to high frequency by modulating the alternation onto a high frequency alternation that is used to generate return to zero levels between digital input signal dependent levels.

6 Claims, 3 Drawing Sheets

CIRCUIT WITH A DIGITAL TO ANALOG CONVERTER

Figure 1:
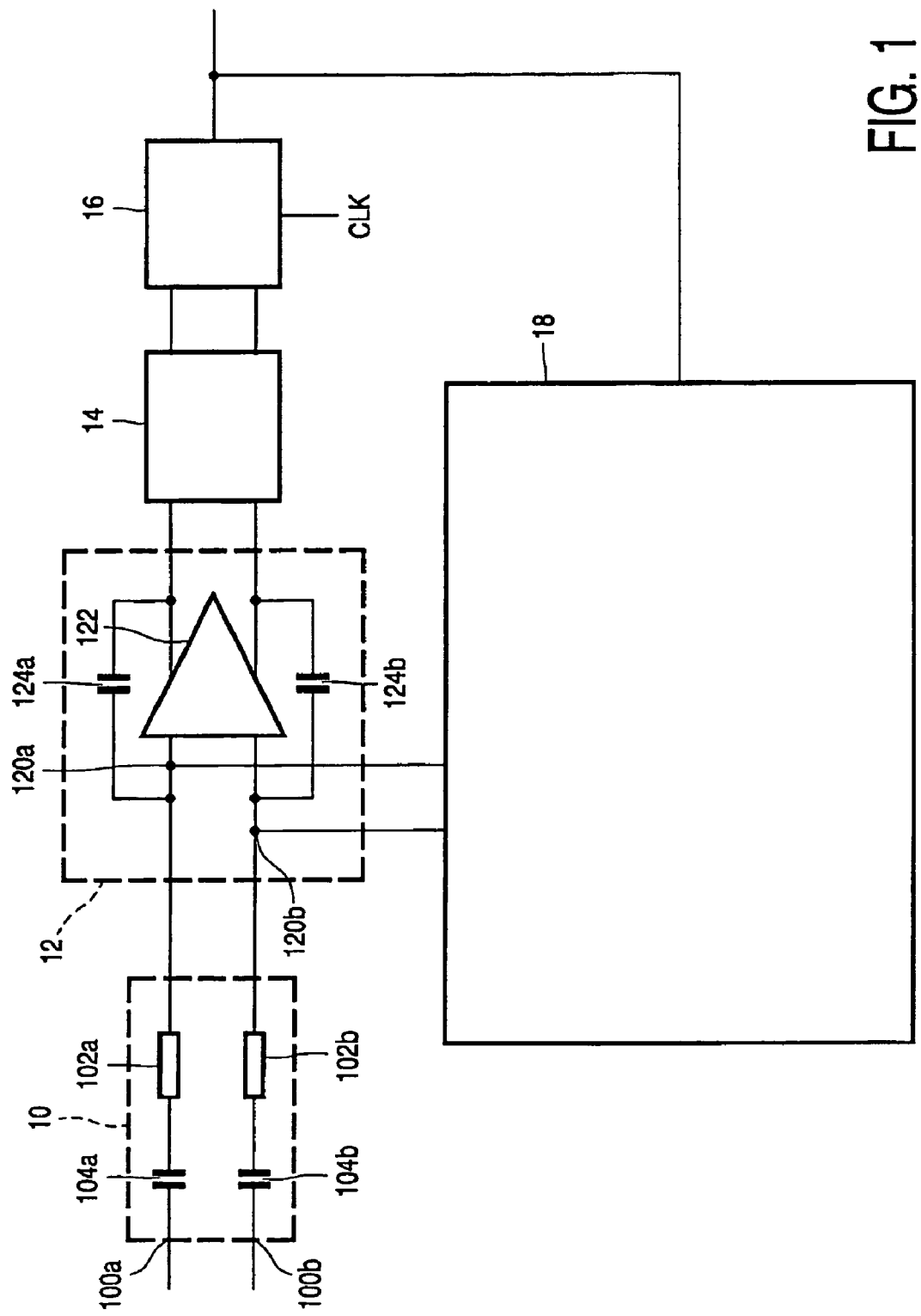

The invention relates to a circuit containing a digital to analog converter. A digital to analog converter uses a series of digital signals to generate an output signal that assumes a series of analog signal levels that are selected from a set of available levels under control of the digital signals. The digital signal is usually a binary signal, each signal value containing one or more bits.

From U.S. Pat. No. 5,608,401 it is known to provide a digital to analog converter with three possible output levels. This circuit contains a voltage source, a load and a plurality of switches in a bridge configuration that makes it possible to apply the voltage of the voltage source across the load in two mutually opposite polarities. In this way two of the possible levels are generated. The third level is generated by completely decoupling the voltage source from the load. U.S. Pat. No. 5,608,401 describes the use of this circuit to avoid quiescent power consumption when no voltage needs to be applied across the load.

One important property of digital to analog converters is dynamic range. This is the ratio between the maximum output amplitude and the quantization noise amplitude between minimally different signals. In general the dynamic range of a digital to analog converter may be increased by using multibit signals with higher number of bits. On the other hand, this makes digital to analog converters more complex, and it increases their sensitivity to non-linearity, which occurs when the steps between successive analog levels that are output for different digital signals are not the same.

One solution to this problem is the sigma delta technique, in which a one bit digital to analog converter is used that operates at much higher sample frequency than needed for the eventual output signal. The output signal of this one bit digital to analog converter is low pass filtered (or band pass filtered). The output of the filter is made to correspond to the desired output signal on average. The filter suppresses quantization noise at unused frequencies. Thus a high dynamic range can be realized, at the same time avoiding the linearity problem because the one bit digital to analog converter has only one step spacing between output levels.

In this way highly linear digital to analog converters with a high dynamic range can be realized. The achievable dynamic range is only limited by the maximum useful sample frequency of the one bit digital to analog converter.

Amongst others it is an object of the invention to provide for a circuit with a digital to analog converter that achieves a high dynamic range and good linearity with a lower sampling frequency, or a higher dynamic range at the same sampling frequency as a one bit digital to analog converter.

The invention provides for a circuit as set forth in claim 1. According to the invention a digital to analog converter is provided with a digital input that can select between at least three levels. Analog output signals for two of the levels are generated by adding the contributions of two signal sources, such as current sources, in the same direction. A middle level between the output levels is generated by subtracting the contributions. Two mutually opposite ways of subtracting are possible: one way in which a first signal source contributes with a positive sign and the second contributes with a negative sign and another way in which the first signal source contributes with a negative sign and the second signal source contributes with a positive sign. These two ways are alternated to ensure that on average the middle level is exactly midway the levels obtained by adding contributions of the signal sources. Thus no accurate calibration is needed to provide a highly linear digital to analog converter.

Preferably the mutually opposite ways of subtraction are alternated in such a way that most of the spectral density of the error signal due to the alternation is concentrated in a band around half the sample frequency of the digital to analog converter, leaving substantially less spectral density in a band around zero frequency.

In principle this can be realized for example by alternating the signs each time when the middle level has to be output. This easily ensures that on average both signs are used with the same frequency, and it maximizes the frequency with which the sign is changed. However, the maximum frequency is limited by the frequency with which the middle level occurs and as a result this frequency may not be high enough.

In an embodiment the circuit uses second, return to zero phases between first phases in which the output signal is determined by the data. In the return to zero phases the contributions also counteract each other. In this embodiment the alternations between the signs with which the contributions counteract each other toggling the signs each time when the third value occurs in a first phase and each time when at least part of the second phases occurs. Thus, a part of the output signal in which the output signal assumes a values obtained by counteracting contributions effectively forms a high frequency digital oscillation signal which switches back and forth between two levels both in first phases and in second phases. The oscillation of this oscillator is phase modulated dependent on the digital input signal when that digital input signal assumes the third value between the high and low values. In this way the spectral density of the deviations of the signal used in the first phases is modulated onto the spectral density of deviations in the second phases. Thereby the spectral density is placed at high frequencies, so that it can be more easily filtered out.

Preferably a differential output is used, the signal sources being both coupled to a first output terminal or both to a second terminal for the two extreme levels, and the signal sources each being coupled to a respective one of the output terminals for generating the middle level.

These and other objects and advantageous aspects of the invention will be described in more detail using the following figures.

Figure 2:
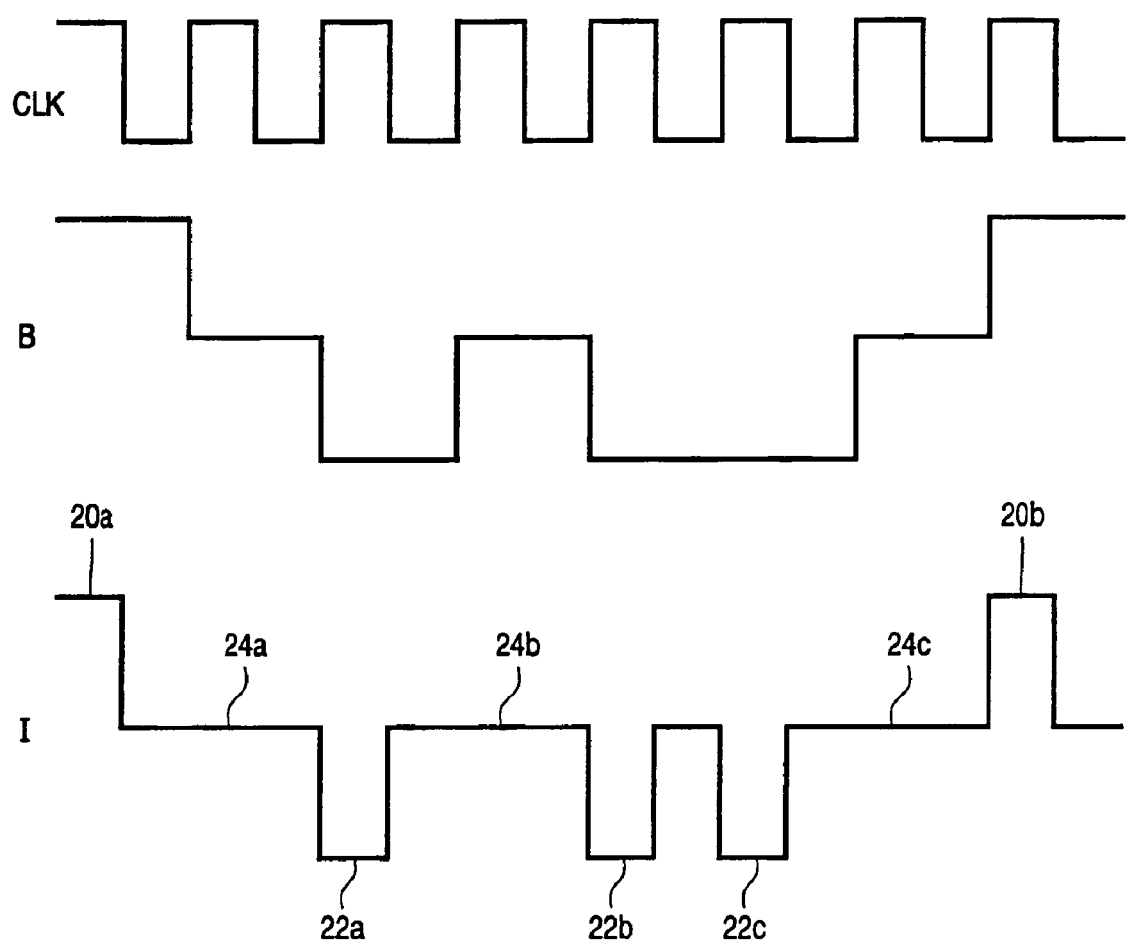
Figure 3:
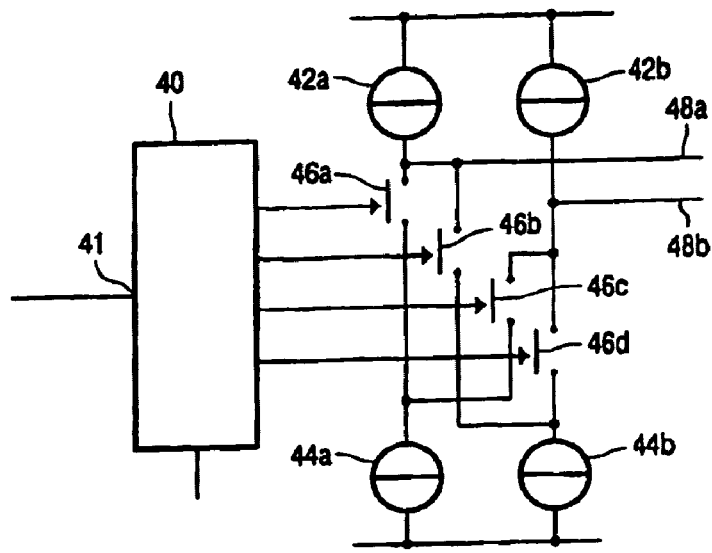
Figure 4:
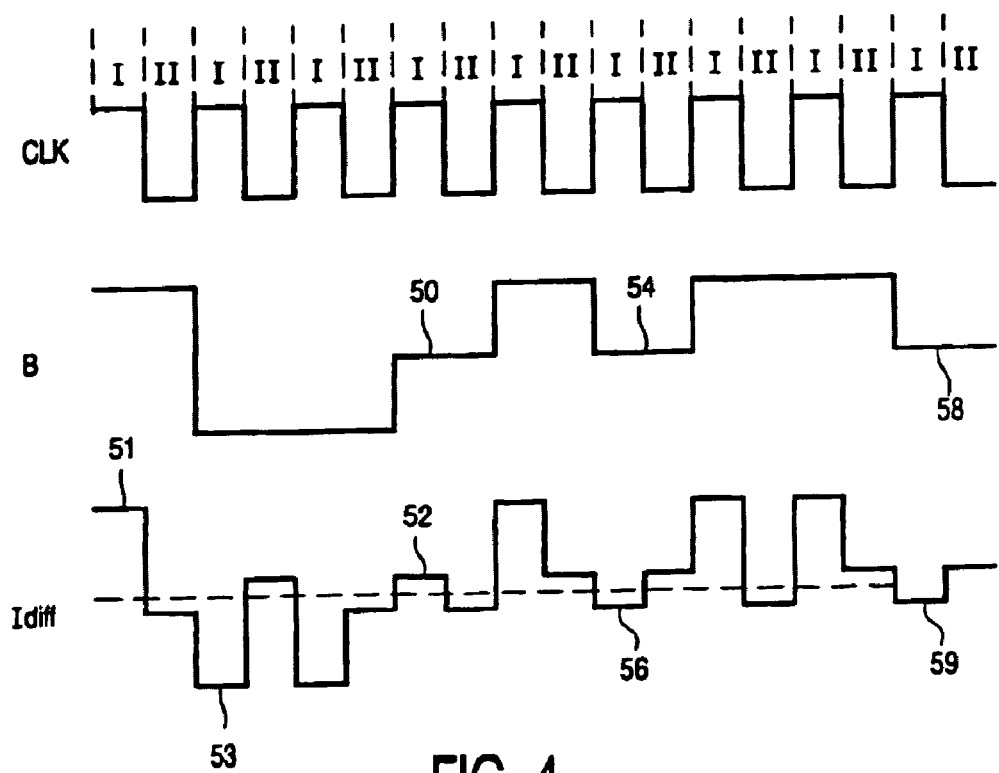

FIG. 1 shows a sigma delta analog to digital converter
FIG. 2 shows signals occurring in a converter
FIG. 3 shows a feedback signal generating circuit
FIG. 4 shows a feedback signal FIG. 1 illustrates use of the digital to analog converter according to the invention in a sigma delta analog to digital converter. The converter contains an input stage 10, a subtraction stage 12, a loop filter 14, a quantizer 16, and a feedback signal generator 18. The input stage 10 has differential input terminals 100a,b and outputs coupled to summing nodes 120a,b of subtraction stage 12. By way of example, input stage 10 is shown to contain a capacitor 104a,b and a resistor 102a,b in series between each input 100a,b and a corresponding summing node 120a,b.

The subtraction stage 12, the loop filter 14 and the quantizer form a digitizing stage for forming a digital output signal from the difference signal, obtained from an average difference between the input signal and the output signal. The subtraction stage 12 contains a differential amplifier 122, with inputs coupled to the summing nodes 120a,b and with feedback capacitors 124a, 124b coupled between the outputs of the amplifier 122 and its inputs. The outputs of the subtraction stage 12 are coupled to the quantizer 16 via loop filter 14. Quantizer 16 has a clock input and an output of the quantizer 16 forms an output of the sigma delta converter. The output of the quantizer 16 is coupled back to an input of the feedback signal generator 18. The feedback signal generator 18 has differential outputs coupled to the summing nodes 120a,b of subtraction stage 12. The loop filter 14 is for example a fourth order filter, but the precise type of filter is not essential for the invention.

In operation, a differential input signal is applied across the inputs 100a,b and a digital output signal is produced at the output of the quantizer 16. Signals corresponding to the differential input signal and the output signal are subtracted from one another by subtraction stage 12. The resulting difference is filtered by loop filter 14 and quantized to determine the output signal. The loop filter 14 averages the difference over time. As a result the sigma delta converter produces an output signal that, averaged over time, tracks the differential input signal.

FIG. 2 shows a clock signal C and a signal B representative of the output signal of the quantizer 16. Quantizer 16 is designed to produce an output signal value for each clock pulse, the output signal taking one of three values. The signal B is limited to the three possible levels representing those values (of course the actual output signal of the quantizer is a digital signal that may represent the levels in any form, for example using a pair of bits for each output signal). The quantizer 16 may be realized for example by using two comparators (not shown) in quantizer 16, the quantizer producing a first value when the difference between the signals at its inputs is below the threshold level of both comparators, a second value when the difference is below one of the threshold levels but above the other and a third value when the difference is above both threshold levels.

Feedback signal generator 18 supplies a feedback signal I corresponding to the signal B to the subtraction circuit. In each clock period a first phase and a second phase occurs. In the first phase the feedback signal I is determined by the signal B in that clock period. In the second phase the feedback signal is independent of the signal B. The second phase serves as a return to zero phase between the first phases of different clock cycles, to eliminate interactive effects between the signals supplied in the first phases of the different clock periods. The feedback signal I supplied in the first phase may take three different values: the same value 24a–d as in the second phase or values 20a–b, 22a–c on opposite sides of that value 24a–d.

When the feedback signal I in the first phase assumes the same value 24a–c as in the second phase this is realized by the same means that are used to realize the signal in the second phase. Thus, a feedback signal I with three possible levels is realized with little or no additional hardware.

FIG. 3 shows a digital to analog converter that contains a decoder 40, a first and second current source 42a,b a third and fourth current source 44a,b and a number of switches 46a–d. A first and a second output 48a,b of the digital to analog converter together form a differential output of the circuit. The first output 48a is coupled to an output of the first current source 42a and the second output 48b of the digital to analog converter is coupled to an output of the second current source 42b. The first output 48a is coupled to outputs of the third and fourth current source 44a,b via respective ones of the switches 46a,b respectively. The second output 48 a is coupled to outputs of the third and fourth current source 44a,b via further respective ones of the switches 46c,d respectively. The first, second, third and fourth current source 42a,b 44a,b are arranged to supply substantially identical output currents. The switches are controlled by decoder 40, under control of a clock input clk and a digital signal received at a digital input 41.

FIG. 4 shows signals illustrating the operation of the circuit of FIG. 3. A first signal clk illustrates the clock signal, alternate first and second phases of the clock cycles are indicated by I and II. A second signal B illustrates an example of a digital input signal. The digital signal contains a series of code values that represent signal values. By way of illustration the digital input signal B is shown to assume three levels that correspond to different code values.

A third signal Idiff illustrates a difference between net currents flowing to the outputs 48a,b. The circuit operates in two alternating phases I, II. In first phases I the decoder 40 controls the switches 46a–d dependent on the data in order to supply a data dependent net current difference to the outputs 48a,b. In second phases II the decoder 40 controls the switches 46a–d to supply a return to zero current difference to the outputs 48a,b.

When the digital input signal B codes for a high level decoder 40 controls the switches 46a–d in the first phase so as to connect the output of both the third and fourth current source 44a,b to the output of the second current source 42b. Thus, the net current at the first output is equal to a current Ia from the first current source 42a. Assuming the currents from the first, second third and fourth current source 42a,b to be identical, the net current at the second output 48b is –Ia. The difference between the net currents at the first and second output is 2Ia, which corresponds to a high level differential output current 51.

Similarly, when the digital input signal B codes for a low level decoder 40 controls the switches 46a–d in the first phase so as to connect the output of both the third and fourth current source 44a,b to the output of the first current source 42b. Thus, the difference between the net currents at the first and second output becomes –2Ia, which corresponds to a low level differential output current 53.

When the digital input signal B codes for a third level decoder 40 controls the switches 46 a–d in the first phase so as to connect the output of the third and fourth current source 44a,b to the output of the first and second current source 42b respectively, or to the second and first current source 42b respectively. Thus, the difference between the net currents at the first and second output becomes zero.

The circuit is made to output the third input signal in the same way as the return to zero level. In the second phase decoder 40 also makes the difference zero by controlling the switches 46a,b to connect the output of the third and fourth current source 44a,b to the output of the first and second current source 42b respectively, or to the second and first current source 42b respectively.

In practice, current sources 42a,b, 44a,b may not supply identical currents due, for example, to geometrical or parameter differences in the implementation of the different current sources. The result of non-identical currents is that the difference in net currents from the outputs 48a,b at the return to zero level is not exactly midway the difference output for the high and the low level. This is not a problem when the return to zero level is used only as a return to zero level and not as third output level that may be selected by the digital input signal B. But it will result in non-linearity of digital to analog conversion when the return to zero level is used as a third output level that may be selected by the digital input signal B.

In order to counter this non linearity the third level is preferably chopped, by using two different states to supply current for the third level so that on average the output current for the third level is exactly midway between the high and low level. In the first state the decoder 40 controls switches 46*a*–*d* to connect the output of first current source 42*a* to the output of the third current source 44*a* and to connect the output of second current source 42*b* to the output of the fourth current source 44*b*. Crosswise, in the second state the decoder 40 controls switches 46*a*–*d* to connect the output of first current source 42*a* to the output of the fourth current source 44*b* and to connect the output of second current source 42*b* to the output of the third current source 44*a*.

The following table summarizes the net currents flowing to the outputs 48*a,b* in the first and second state, in terms of I1, I2, I3, I4, the currents from the first, second, third and fourth current source 42*a,b* 44*a,b* respectively. Additionally, the currents with high and low digital input B are included in the table.

|         | output 48a   | output 48b   | difference        |
|---------|--------------|--------------|-------------------|
| B high  | I1           | I2 − I3 − I4 | I1 − I2 + I3 + I4 |
| B low   | I1 − I3 − I4 | I2           | I1 − I2 − I3 − I4 |
| State 1 | I1 − I3      | I2 − I4      | I1 − I2 − I3 + I4 |
| State 2 | I1 − I4      | I2 − I3      | I1 − I2 + I3 − I4 |

It will be remembered that I1–I4 are all substantially equal, except for inaccuracies. It will be noted that the current difference deviates with opposite polarity from I1–I2 and for high and low input signals B. In the first and the second state there are small deviations from the level I1–I2 midway between the levels for the high and low input signal B. The average of the levels for the first and second state is exactly at this level I1–I2 midway between the levels for the high and low input signal B. This will be used to counteract the non-linearities even if the currents are not equal to each other.

Decoder 40 is preferably arranged to make use of both state 1 and state 2 to produce the output current when the digital input signal assumes the third level between the high and the low level and/or in the second phases. In different clock cycles decoder 40 selects different states, so that on average the output current for the third level is midway between the high and low level, i.e. the two states are selected just as frequently. Thus, loop filter 14 will average out the non-linearity that occurs when the third level is used.

Various methods may be used to select the states used to control the output current in the first phases I when the input signal assumes the third value. Each method should preferably ensure that both states occur just as frequently, at least on average. Of course the current in each individual state still deviates from the ideal value, but because the current is equal to the ideal value on average most of the deviation is filtered out by the loop filter 14. Preferably, as much of the spectral density of the deviations should be moved to frequencies that are filtered out by the loop filter 14. Therefore, the method of selection of the states should preferably promote that the spectral density of the deviations is moved to higher frequencies (frequencies that are filtered out by the loop filter 14).

In a first set of embodiments the states used in the first phases I are selected independent of the states used in the second phases II. However, this limits the maximum frequency to which the spectral density of the deviations can be used. Therefore in a second set of embodiments selection of the states used in the first and second phases is dependent on one another. This makes it possible to move the spectral density to higher frequencies.

In the embodiments in which the states used in the first phases I are selected independent of the states used in the second phases II any state may be used to provide the return to zero current in the second phases II between the first phases I in which input signal controlled currents are supplied. For example, the same state may always be used in the second phase. This leads to a DC offset signal, but such an offset signal is irrelevant in most applications such as audio output or wireless signal reception. Alternatively, the state used in the second phase may be alternated in successive clock cycles. In yet another alternative, the state used in the second phase may be toggled from one clock cycle to another. Of course, when no return to zero levels are needed the circuit may simply provide input signal controlled output currents during the entire clock period. In this case no second phase is needed, or the second phase may last only temporarily, in transients during switching.

When the states used in the first phases are selected independent of the states used in the second phases various methods may be used to select the states in the first phases I. In a first embodiment, decoder 40 simply uses state 1 and state 2 alternately when the third level occurs. Thus it is easily ensured that the average current difference for the third level is midway between the current differences for the high and low level. This can be implemented for example by including a toggle flip-flop (not shown) in decoder 40, the toggle flip-flop controlling the state used to control the switches 46*a*–*d* when the input signal B selects the third level, the toggle flip-flop toggling each time when the input signal B selects the third level. In this way the spectral density of the deviations is moved to higher frequencies, but the maximum frequency is limited by the frequency with which the third level occurs. When the maximum frequency is low, the spectral density is small, since the third level occurs with low frequency, but in some applications this frequency is too low to average out the deviations.

In an embodiment decoder 40 uses state 1 in even clock cycles and state 2 in odd clock cycles. This also ensures that the average current difference for the third level is midway between the current differences for the high and low level. This can be implemented for example by including a toggle flip-flop (not shown) in decoder 40, the toggle flip-flop controlling the state used to control the switches 46*a*–*d* when the input signal B selects the third level, the toggle flip-flop toggling each clock cycle. In yet another embodiment an pseudo random generator, such as a properly designed LFSR (Linear Feedback Shift Register) may be used to toggle the toggle flip-flop. In all of these embodiments the maximum frequency to which the spectral density of the deviations is moved is limited by the frequency with which the third level occurs. In some applications this frequency is too low to average out the deviations.

In another embodiment, the previous input signal is used to select the state in the first phase I. That is, when a third level input signal occurs in a clock cycle and the input signal in the previous clock cycle was high, the first state is selected in the clock cycle. When the input signal in the previous clock cycle was low the second state is selected. When the previous input signal has the third value the state is toggled relative to the state of the preceding clock cycle. Since both high and low levels occur equally frequently this ensures that on average both states occur equally frequently. This method of selecting the states can be implemented for example using a latch (not shown) in decoder 40, the latch latching the previous input signal when that input signal was high or low and the latch latching the logic opposite of its previous content when the input signal assumed the middle value. However, this method has the drawback that the states are correlated with the input signal in such a way that part of the spectral density of the deviations occurs at low frequencies.

The spectral density of the deviations can be moved to higher frequencies when selection of the states used in the first phases and the second phases is made interdependent. FIG. 4 shows the result of an alternative embodiment for selecting the state used in the first phase. In this embodiment decoder 40 alternates the selected state each time when the middle value is output, both when it is output in a first phase and when it is output in a second phase. This alternative embodiment can be implemented in various ways. For example by including a toggle flip-flop (not shown) in decoder 40, the toggle flip-flop controlling the state used to control the switches 46a–d when the third level is output both in the first phase and the second phase, the toggle flip-flop toggling each time such a third level is output. An alternative implementation is for example the use of toggling signal that toggles between successive phases independent of the data B, and a flip-flop that is toggled each clock cycle the digital input signal B does not assume the middle value. In this alternative embodiment a signal that selects the state to be used is formed by forming an exclusive OR of the toggling signal and the output of the flip-flop.

Thus, as long as a high or low value is output in the first phase of a clock cycle, the state used to output the RTZ level in the second phase is simply toggled between the first and second state. When a third value is output in a clock cycle, different states will be used in the first and second phase, the state in the first phase being selected dependent on the state used in the last previous clock cycle.

In FIG. 4, for example, the states used in successive second phases are alternated unless a third level signal occurs in the intervening first phase (the different states are recognizable from slightly higher and lower levels 52, 56). In a first clock cycle a middle value input signal 50 occurs. In this first clock cycle the first state (shown as having a slightly higher level 52 than the level midway between the high and the low level) is used to generate the output signal in the first phase. In a next clock cycle in which a middle value of the input signal 54 occurs, the second state is used (shown as having a slightly higher level 56 than the level midway between the high and the low level), because an odd number of clock cycles has occurred since the previous cycle in which the input signal assumed middle value 50. In the next clock cycle in which input signal assumes the middle value 58 the second state 59 is used again because this time an even number of clock cycles gas occurred since the previous middle value 54.

In this way the signals output for successively selected ones of the states effectively form the output signal of a digital oscillator with a nominal oscillation period corresponding to half the sample frequency. The oscillation of this oscillator is phase modulated dependent on the digital input signal B when that digital input signal assumes the third value between the high and low values. In this way the spectral density of the deviations of the signal used in the first phases is modulated onto the spectral density of deviations in the second phases. Thereby the spectral density is placed at high frequencies, so that it can be more easily filtered out. This is achieved at the expense of the spectral density of deviations due to selection of the state used for the RTZ level in the second phases. Compared with the embodiment in which the state used for the RTZ level in the second phases is alternated independent of the data part of the spectral density due selection of different states in the second phases is moved to lower frequency. However, this spectral density still remains at frequencies that can easily be filtered out.

It will be appreciated that, without deviating from the invention, the states used in the first phases I when the digital input signal assumes the middle value can be made part of a high frequency digital oscillation signal in other ways. For example a slightly lower frequency digital oscillation signal may be used that toggle in only part of the clock cycles when the digital input signal does not assume the high or low value, or a high frequency pseudo-random oscillation may be used to successively select the states for successive second phases and first phases in which the middle value is output.

Although the digital to analog converter of FIG. 3 has been presented in the context of the sigma delta analog to digital converter of FIG. 1, it will be appreciated that the digital to analog converter can also be used outside this context, especially if a filter is provided to suppress error signals that are due to the switching between states. However, the filter may be implicit, because the errors have no effect, for example in an audio system of which users cannot hear the higher frequencies. The digital to analog converter may be used for example at the output of a digital audio system.

It may be convenient to use a digital conversion circuit (for example a digital sigma delta converter) to convert N-bit digital signals to signals that select between the three allowed values prior to applying digital signals to the input of the decoder.

Without deviating from the invention other means than subtraction stage may be used to generate an output signal. For example, the outputs 48a,b may be connected to a common node via resistors, the resulting differential output voltage difference between the outputs 48a,b being used as output signal. Instead of two current sources 44a,b, two voltage sources may be used to generate the output signal, the output voltage being added or subtracted from one another to obtain the output signal.

Also it will be appreciated that, although the invention was illustrated for a circuit with three possible digital input values, the invention can easily be extended to circuits with more possible digital input values, preferably with 2*n+1 input values (n being an arbitrary positive integer), the return to zero value providing the middle level of these 2*n+1 levels. This may be realized for example by including more second current sources in parallel with the third and fourth current source 44a,b, together with additional switches to select which of the additional current sources is coupled to which one of the outputs 48a,b. However, a three level circuit is preferred because with the invention this does not require accurate calibration of the difference between adjacent levels.

The invention claimed is:
1. An electronic circuit comprising
an analog output for outputting analog signal levels selected from at least three available levels under control of digital input signals;
multiple signal sources;
a control circuit arranged to couple the signal sources to the analog output in dependence upon a digital input signal;
wherein the control circuit couples the signal sources so that:

when the digital input assumes a first value, signals from the signal sources combine to form one of said available levels;

when the digital input assumes a second value, signals from the signal sources combine to form another one of said available levels;

when the digital input assumes a third value;
- in one state, signals from certain ones of the signal sources combine so as to at least partially counteract each other, and
- in another state, signals from different ones of the signal sources combine so as to at least partially counteract each other, the one state and the other state occurring with substantially equal frequency.

2. An electronic circuit according to claim 1, wherein the control circuit selects the first state and the second state so that substantially all of a spectral density of a deviation signal due to said alternating of said signs is concentrated closer to half of a sample frequency of the circuit than to zero frequency.

3. An electronic circuit according to claim 1, operable in alternating first and second phases, wherein:
- in the first phases, the control circuit couples the signal sources to the analog output in dependence on the digital input signal, said first and second states being selected alternately in successive occurrences of the first phase when the digital input signal assumes the third value;
- in the second phases, the control circuit makes the source signals counteract each other, said first and second states being selected alternately in at least selected occurrences of the second phase.

4. An electronic circuit according to claim 1, comprising a differential output with a first and a second terminal (48a,b) the control circuit coupling both signal sources (44a,b) to the first terminal (48a) when the digital input signal (B) assumes the first value, the control circuit coupling both signal sources (44a,b) to the second terminal (48b) when the digital input signal (B) assumes the second value, and when the digital input signal (B) assumes the third value (50, 54), the control circuit (40, 46a–d) in a first state coupling the first and second signal source (44a,b) to the first and second terminal (48a,b) respectively and the control circuit (40, 46a–d) in a second state coupling the first mid second signal source (44a,b) to the second and first terminal (48b,a) respectively, the control circuit alternating use of the first and second state so that both states occur with substantial equal frequency.

5. An electronic circuit according to claim 1, wherein the signal sources are current sources, their contribution being substantially time constant currents.

6. An electronic circuit according to claim 1, comprising an analog to digital convener with a digital output, a substractor circuit for subtracting a feedback signal determined from a digital output signal from an analog input signal, a quantizer for quantizing a result of the subtraction and a loop filter between the subtractor circuit and the quantizer, the digital to analog converter generating the feedback signal from the digital output signal, the loop filter suppressing spectral density of a deviation signal due to switching between said first and second states.

* * * * *